(12) United States Patent
Xu et al.

(10) Patent No.: US 11,750,510 B2
(45) Date of Patent: Sep. 5, 2023

(54) FPGA DEVICE FOR IMPLEMENTING EXPANSION OF TRANSMISSION BANDWIDTH OF NETWORK-ON-CHIP

(71) Applicant: WUXI ESIONTECH CO., LTD., Jiangsu (CN)

(72) Inventors: Yanfeng Xu, Wuxi (CN); Yueer Shan, Wuxi (CN); Jicong Fan, Wuxi (CN); Yanfei Zhang, Wuxi (CN); Hua Yan, Wuxi (CN)

(73) Assignee: WUXI ESIONTECH CO., LTD., Jiangsu (CN)

( * ) Notice: Subject to any disclaimer, the term of this patent is extended or adjusted under 35 U.S.C. 154(b) by 211 days.

(21) Appl. No.: 17/236,400

(22) Filed: Apr. 21, 2021

(65) Prior Publication Data

US 2022/0006733 A1 Jan. 6, 2022

Related U.S. Application Data

(63) Continuation-in-part of application No. PCT/CN2020/141183, filed on Dec. 30, 2020.

(30) Foreign Application Priority Data

Jul. 1, 2020 (CN) .......................... 202010622784.7

(51) Int. Cl.
*H04L 45/58* (2022.01)
*H04L 49/109* (2022.01)

(52) U.S. Cl.
CPC .......... *H04L 45/583* (2013.01); *H04L 49/109* (2013.01)

(58) Field of Classification Search
CPC ..... H04L 45/583; H04L 49/109; H04L 45/60; H04L 49/106; H04L 49/40; G06F 30/347
See application file for complete search history.

(56) References Cited

U.S. PATENT DOCUMENTS

| 9,036,482 | B2 | 5/2015 | Lea | |
|---|---|---|---|---|
| 2010/0100707 | A1* | 4/2010 | Mejdrich | ................ H04L 45/58 |
| | | | | 712/205 |
| 2019/0028387 | A1* | 1/2019 | Gray | ....................... H04L 45/60 |

(Continued)

FOREIGN PATENT DOCUMENTS

| CN | 101977152 | 2/2011 |
|---|---|---|
| CN | 102073481 | 5/2011 |

(Continued)

*Primary Examiner* — Dady Chery
(74) *Attorney, Agent, or Firm* — Hamre, Schumann, Mueller & Larson, P.C.

(57) ABSTRACT

The present disclosure discloses an FPGA device for implementing a network-on-chip transmission bandwidth expansion function, and relates to the technical field of FPGAs. When a predefined functional module with built-in hardcore IP nodes is integrated in an FPGA bare die, soft-core IP nodes are configured and formed by using logical resource modules in the FPGA bare die and are connected to the hardcore IP nodes to form an NOC network structure, so as to increase nodes and expand the transmission bandwidth of the predefined functional module. On the other hand, the soft-core IP nodes can be additionally connected to input and output signals in the predefined functional module and also can expand the transmission bandwidth of the predefined functional module.

17 Claims, 4 Drawing Sheets

(56) References Cited

U.S. PATENT DOCUMENTS

2019/0044519 A1* 2/2019 Atsatt .............. H03K 19/17768
2019/0266088 A1* 8/2019 Kumar ................. H04L 45/586

FOREIGN PATENT DOCUMENTS

| CN | 103106173 | 5/2013 |
| CN | 103809999 | 5/2014 |
| CN | 104683249 | 6/2015 |
| CN | 105653477 | 6/2016 |
| CN | 107807901 | 3/2018 |
| CN | 110515891 | 11/2019 |
| CN | 110647495 | 1/2020 |
| CN | 111679615 | 9/2020 |
| CN | 111786894 | 10/2020 |

\* cited by examiner

FPGA DEVICE FOR IMPLEMENTING EXPANSION OF TRANSMISSION BANDWIDTH OF NETWORK-ON-CHIP

CROSS-REFERENCE TO RELATED APPLICATIONS

This application is a continuation-in-part of International Application PCT/CN2020/141183, filed on Dec. 30, 2020, which claims priority to Chinese Patent Application No. 202010622784.7, filed on Jul. 1, 2020. Both of the aforementioned applications are hereby incorporated by reference in their entireties.

FIELD OF THE INVENTION

The present disclosure relates to the technical field of FPGAs, more particular, to an FPGA device for implementing a network-on-chip transmission bandwidth expansion function.

BACKGROUND

With the continuous improvement of an integrated circuit manufacturing technology level and the rapid increase of data volume, artificial intelligence has made rapid progress in recent years, especially in March 2016, AlphaGo played a man-versus-machine Go match with Lee Sedol who is a Go world champion and professional 9-dan Go player, and won with the total score of 4 to 1, which pushed the artificial intelligence to an unprecedented level. The rapid development of the artificial intelligence cannot be achieved without the improvement of efficiency of big data, high-performance computing and machine learning algorithms. When the machine learning algorithms are still in the phase of constant iterative optimization, FPGAs have unique advantages in the field of artificial intelligence due to programmability and powerful vector operation capability thereof. In the field of FPGAs, FPGA architecture is optimized and dedicated artificial intelligence engines are added to improve artificial intelligence efficiency. Therefore, there are now practices to design and integrate dedicated AI modules within FPGA bare dies. However, AI module integration in the FPGA bare dies is greatly limited by chip structures, transmission bandwidth and computing efficiency, so it is difficult to achieve an expected working effect.

SUMMARY OF THE INVENTION

With respect to the above problems and technical requirements, the inventor proposes an FPGA device for implementing a network-on-chip transmission bandwidth expansion function, wherein the FPGA device includes an FPGA bare die, the FPGA bare die includes a plurality of logical resource modules, a predefined functional module is further integrated inside the FPGA bare die and has N built-in hardcore IP nodes, adjacent hardcore IP nodes are connected through routing channels, and input and output signals in the predefined functional module are connected to the hardcore IP nodes; M soft-core IP nodes are further configured and formed in the FPGA bare die through the logical resource modules therein; the nodes in the FPGA bare die are connected through the routing channels to form an NOC network structure, the nodes include N hardcore nodes and M soft-core nodes, each of the nodes includes a functional IP, a network interface and a router respectively, the functional IP is connected to the router through the network interface, and the routers in every two adjacent nodes are connected through the routing channels; and the predefined functional module intercommunicates with external signals through the N built-in hardcore IP nodes and the M soft-core IP nodes formed by expansion.

According to a further technical solution, part of the input and output signals in the predefined functional module are connected to the built-in hardcore IP nodes, the M soft-core IP nodes configured and formed in the FPGA bare die are further connected to the input and output signals in the predefined functional module that are not connected to the hardcore IP nodes.

According to a further technical solution, in addition to being connected to the input and output signals of the predefined functional module inside the FPGA bare die, the M soft-core IP nodes intercommunicate with an external structure outside the FPGA bare die.

According to a further technical solution, each soft-core IP node is configured and formed by a single logical resource module in the FPGA bare die, or configured and formed jointly by the plurality of logical resource modules.

According to a further technical solution, the logical resource modules in the FPGA bare die that are configured to configure and form soft-core IP nodes include at least one of a CLB, a BRAM and a DSP.

According to a further technical solution, the predefined functional module integrated in the FPGA bare die is an AI module.

The FPGA device further includes a substrate and a silicon connection layer laminated on the substrate, and the FPGA bare die is laminated on the silicon connection layer; a silicon connection layer NOC network is built within the silicon connection layer and includes a plurality of silicon connection layer routing nodes connected through the routing channels, each of the silicon connection layer routing nodes includes a functional IR a network interface and a router, and the functional IP is connected to the router through the network interface. The FPGA bare die further includes a silicon-stacked connection module and connection point leading-out terminals, the silicon-stacked connection module includes a plurality of silicon-stacked connection points, the nodes in the FPGA bare die are connected to the corresponding silicon-stacked connection points, and the silicon-stacked connection points are connected to the corresponding connection point leading-out terminals through a top metal wire in a rewiring layer. The connection point leading-out terminals in the FPGA bare die that are connected to the nodes therein are connected to the routers in the silicon-stacked connection points through the routing channels, so that the nodes in the FPGA bare die are connected to the silicon connection layer routing nodes to form the NOC network structure, and the predefined functional module intercommunicates with the external signals through the N built-in hardcore IP nodes, the M soft-core IP nodes formed by expansion and the silicon connection layer routing nodes.

According to a further technical solution, the silicon connection layer includes a plurality of silicon connection layer routing nodes including different functional IPs.

According to a further technical solution, the functional IPs in the silicon connection layer routing nodes are memory chips, and the memory chips include at least one of an HMB, a DDR4 and a DDR5.

According to a further technical solution, the functional IPs in the silicon connection layer routing nodes are FIFO and configured to implement a caching function.

DETAILED DESCRIPTION OF THE INVENTION

Specific implementations of the present disclosure are further described below with reference to the accompanying drawings.

Figure 1:
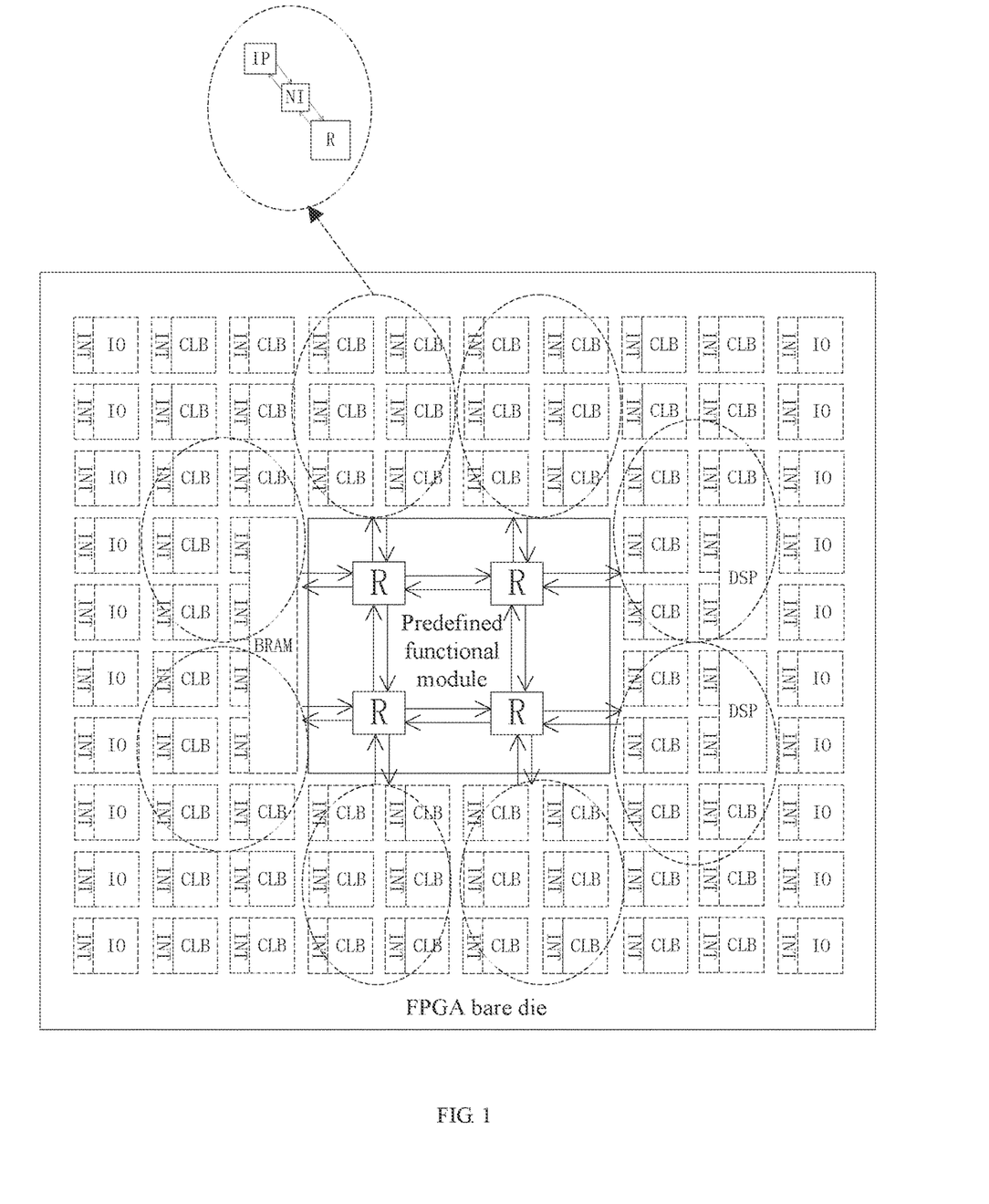
FIG. 1 is a schematic diagram of connections between nodes in an FPGA bare die according to the present disclosure.
Figure 2:
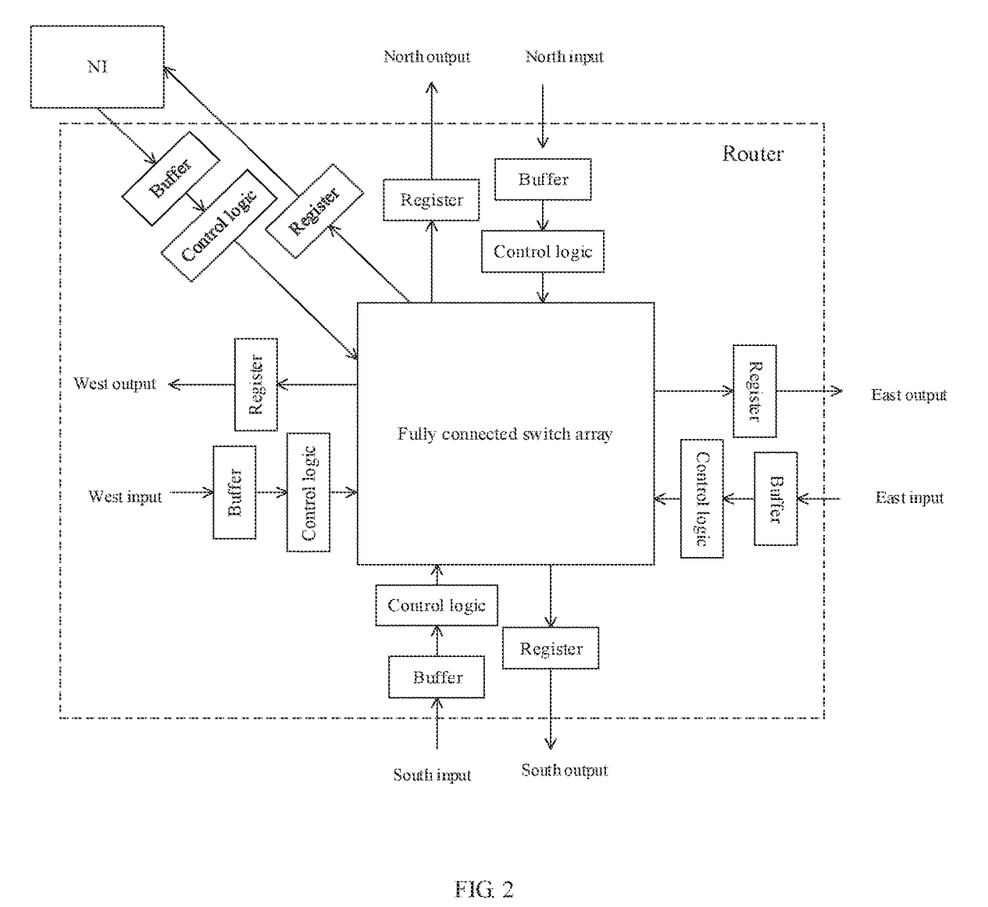
FIG. 2 is a schematic structural diagram of a router in each node according to the present disclosure.

The present disclosure discloses an FPGA device for implementing expansion of a transmission bandwidth of a network-on-chip. The FPGA device includes at least an FPGA bare die. The FPGA bare die includes a plurality of logical resource modules. The logical resource modules include common CLBs, PLBs, BRAMs, DSPs, PCs, IOBs, and so on. Each logical resource module has an interconnected resource module (INT) structurally identical and distributed around the logical resource module. Horizontal or vertical connection lines between the logical resource modules are all connected via the INT modules. In addition, a predefined functional module is further integrated in the FPGA bare die. N hardcore IP nodes are directly built in the predefined functional module. Adjacent hardcore IP nodes are connected through routing channels. In an embodiment, the routing channels are hardwired routing channels. Each hardcore IP node includes a functional IP, a network interface (NI) and a router (R) respectively. The functional IP is connected to the router through the network interface. The routers in the adjacent hardcore IP nodes are connected through the routing channels. Referring to FIG. 1, a hardcore IP node is simply represented with R, and the NI and the IP in each hardcore IP node that are connected to the R are not shown in detail. Nodes in the predefined functional module are just the hardcore IP nodes, and FIG. 1 shows an example in which four hardcore IP nodes are built in the predefined functional module. Referring to FIG. 2, each router R in the hardcore IP node includes a 5*5 fully interconnected switch array (cross bar in the figure) and five sets of input and output ports connected thereto. The fully interconnected switch array implements interconnection under the control of a corresponding control module. The specific structure and control method of the cross bar are conventional technologies, and are not detailed in the present disclosure. One set of input and output ports are connected to the corresponding network interface NI, while the other four sets of input and output ports are arranged in four different directions respectively, for example, East, South, West and North as shown in the figure, and are respectively configured to be connected to adjacent routers in the four directions. A set of input and output ports in each direction may be connected to any set of input and output ports in the adjacent routers. Each set of input and output ports have a buffer arranged at the input port and a register arranged at the output port. Input and output signals in the predefined functional module are connected to the hardcore IP nodes. However, limited by an actual structure, only part of the input and output signals can be connected to the hardcore IP nodes in the predefined functional module. Typically, the predefined functional module is an AI module, and in this case, the functional IP in the hardcore IP node inside the AI module is an AI engine. In conventional practice, based on the above structure, the predefined functional module directly utilizes N built-in hardcore IP nodes for external communication, but the present disclosure provides a new approach:

M soft-core IP nodes are further configured and formed in the FPGA bare die through the logical resource modules therein. Each soft-core IP node also includes a functional IP, a network interface (NI) and a router (R). The functional IP is connected to the router through the network interface. The structure thereof is the same as that of the hard-core IP nodes, except that the soft-core IP nodes are configured and formed through the logical resource modules in the FPGA bare die. All the nodes in the FPGA bare die, including the N hardcore nodes and the M soft-core nodes, are connected through the routing channels to form an NOC network structure. A dashed box as shown in FIG. 1 represents a soft-core IP node configured and formed by using a logical resource module in the dashed box. Therefore, FIG. 1 shows an example in which 8 soft-core IP nodes are configured and formed. In FIG. 1, nodes outside the predefined functional module are soft-core IP nodes and nodes inside the predefined functional module are hardcore IP nodes. FIG. 1 shows an example in which 8 soft-core IP nodes are configured and formed. Specifically, routers in every two adjacent nodes are connected through the routing channels. The router of each node may be connected to the routers of other nodes in the four directions thereof. The predefined functional module uses the formed NOC network structure for external communication. Thus, the predefined functional module may intercommunicate with external signals through the N built-in hardcore IP nodes and the M soft-core IP nodes formed by expansion. The M soft-core IP nodes may transfer data to the N hardcore IP nodes, which increases the transmission bandwidth of the predefined functional module compared with the manner of directly using the N hardcore nodes for communication. In addition, the M soft-core IP nodes are further connected to the input and output signals in the predefined functional module that are not connected to the hardcore IP nodes, which may further increase the transmission bandwidth of the predefined functional module.

The M soft-core IP nodes are not only connected to the hardcore IP nodes/input and output signals inside the predefined functional module, but also connected to the input and output signals inside the FPGA bare die, for use by output and input of other FPGAs. When the soft-core IP nodes are configured and formed by the logical resource modules, each soft-core IP node is configured and formed by a single logical resource module inside the FPGA bare die, or configured and formed jointly by the plurality of logical resource modules. As there is much content in each soft-core IP node, the soft-core IP node is generally configured jointly by a plurality of logical resource modules. In the case that a soft-core IP node is configured and formed by the plurality of logical resource modules, taking a conventional column-based FPGA architecture as an example, a plurality of logical resource modules in the same column may be used to form a soft-core IP node, or a plurality of logical resource modules in different columns may be used to form a soft-core IP node. The logical resource modules in the FPGA bare die that are configured to configure and form soft-core IP nodes include at least one of a CLB, a BRAM and a DSP.

Figure 3:
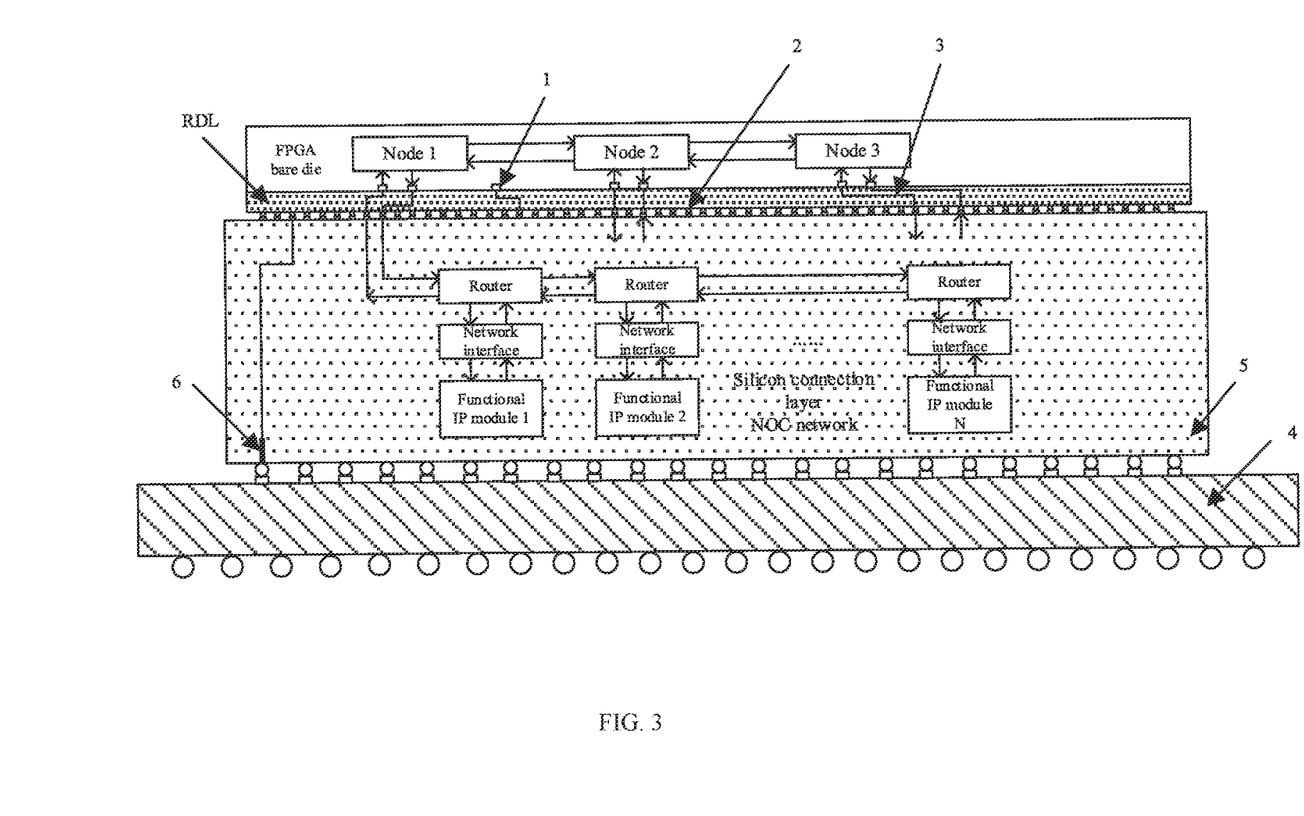
FIG. 3 is another schematic structural diagram of an FPGA device according to the present disclosure.

Further, referring to FIG. 3, the FPGA bare die in the present disclosure is different from a conventional FPGA bare die. In addition to the logical resource modules, it further includes specially designed silicon-stacked connection modules. Each silicon-stacked connection module includes a plurality of bare die silicon-stacked connection points 1. In the FPGA bare die in the present disclosure, some conventional logical resource modules in the conventional FPGA bare die are replaced with silicon-stacked connection modules. Moreover, conventional logical resource modules at any position can be replaced according to signal interconnection requirements. For example, for an existing conventional column-based FPGA architecture, the FPGA bare die in the present disclosure can be obtained by arranging the silicon-stacked connection modules in a row-column structure of the CLB or by arranging the silicon-stacked connection modules in a row-column structure of the BRAM. Each silicon-stacked connection module in the FPGA bare die in the present disclosure also has an interconnected resource module distributed around the silicon-stacked connection module. Therefore, a winding structure of the FPGA bare die in the present disclosure can be consistent with the conventional FPGA bare die without any changes. Horizontal or vertical connection lines between the silicon-stacked connection modules and various other logical resources are all connected through the INT modules. The silicon-stacked connection modules LNK are directly connected to interconnection switches in the interconnected resource modules INT corresponding thereto, which is a part of an interconnection line. The silicon-stacked connection modules LNK and the interconnection switches can be fully or partially interconnected according to connectivity requirements.

The FPGA bare die in the present disclosure further includes bare die connection point leading-out terminals 2 corresponding to the bare die silicon-stacked connection points 1, and the bare die silicon-stacked connection points 1 on the FPGA bare die are connected to the corresponding bare die connection point leading-out terminals 2 through a top metal wire 3 in a rewiring layer (RDL layer). That is, the bare die silicon-stacked connection points 1 and the bare die connection point leading-out terminals 2 are in different planes. The bare die connection point leading-out terminals 2 are generally arranged in a row-column structure along a first direction and a second direction according to stack interconnection requirements. In addition, to achieve a larger connection bandwidth, a plurality of rows/columns of bare die connection point leading-out terminals 2 may be arranged. That is, a plurality of rows of bare die connection point leading-out terminals 2 are arranged in each FPGA bare die along the first direction, and/or a plurality of columns of bare die connection point leading-out terminals 2 are arranged along the second direction, so as to implement efficient multi-row and multi-column two-dimensional cascade. When a plurality of rows/columns of bare die connection point leading-out terminals 2 are arranged along each direction, the bare die connection point leading-out terminals may be uniformly arranged at intervals or randomly arranged. According to actual interconnection requirements, some bare die functional modules are connected to the bare die silicon-stacked connection points 1, and the bare die silicon-stacked connection points 1 are connected to the corresponding bare die connection point leading-out terminals 2 through a top metal wire in a rewiring layer. According to actual interconnection requirements, the routers in some nodes inside the FPGA bare die are connected to the bare die silicon-stacked connection points 1, and the silicon-stacked connection points 3 are connected to the corresponding bare die connection point leading-out terminals 2 through a top metal wire in a rewiring layer.

The FPGA device further includes a substrate 4 and a silicon connection layer 5 laminated on the substrate, and the FPGA bare die is laminated on the silicon connection layer 5. In an embodiment, the silicon connection layer 5 itself is a silicon die. The silicon connection layer NOC network is arranged in the silicon connection layer 5. The silicon connection layer NOC network includes a plurality of silicon connection layer routing nodes connected through the routing channels, and each silicon connection layer routing node includes a functional IP module (IP) and a router (R) connected through a network interface (NI). Adjacent silicon connection layer routing nodes are connected through routing channels connected between the routers, and the structure of each silicon connection layer routing node is similar to that of the hardcore IP node, which is not introduced in the present disclosure again. In this structure, in the silicon connection layer NOC network, each silicon connection layer routing node may be connected to adjacent silicon connection layer routing nodes in four directions, and the silicon connection layer routing nodes form a two-dimensional interconnection array. Moreover, the silicon connection layer routing nodes achieve bidirectional interconnection through the routing channels. Therefore, any silicon connection layer routing node may be connected to any of the other silicon connection layer routing nodes through the routing channels. That is, the functional IP in each silicon connection layer routing node can transmit data to the functional IP of any of the other silicon connection layer routing nodes, and also can receive data from the functional IP of any of the other silicon connection layer routing nodes. An information transmission path is shown by a dotted line in FIG. 4. It is to be noted that the shape of the silicon connection layer NOC network is not defined, and it is neither necessary to lay a square structure nor necessary to lay a silicon connection layer routing node on each lattice in the silicon connection layer 5. It is only necessary to use the routing channels to connect adjacent silicon connection layer routing nodes. Therefore, lengths of the routing channels between the adjacent silicon connection layer routing nodes can vary.

The silicon connection layer routing nodes in the silicon connection layer NOC network are connected to the connection point leading-out terminals 2 on the FPGA bare die through the routers R so as to be connected to the routers R in the corresponding nodes in the FPGA bare die. For example, the nodes inside the FPGA bare die in FIG. 3 includes hardcore IP nodes as well as soft-core IP nodes, so that the nodes inside the FPGA bare die are connected to the silicon connection layer NOC network to form a larger-scale NOC network structure. Further, the predefined functional module is expanded to be capable of intercommunicating with external signals through the N built-in hardcore IP nodes and the M soft-core IP nodes formed by expansion, thereby further increasing the transmission bandwidth. Generally, limited by the number of externally connected pins (about 2000) on the FPGA bare die, the number of nodes on the FPGA bare die is limited. However, in the present disclosure, the bare die is connected to the silicon connection layer, which greatly increases the number of nodes on the FPGA bare die and the number of externally connected signals (at least 40,000 per chip). The silicon connection layer 5 is further provided with a through-silicon via 6, and the IOB on the FPGA bare die is connected to the substrate 4 through the through-silicon via 6 on the silicon connection layer 5, so as to finally lead out signals.

Figure 4:
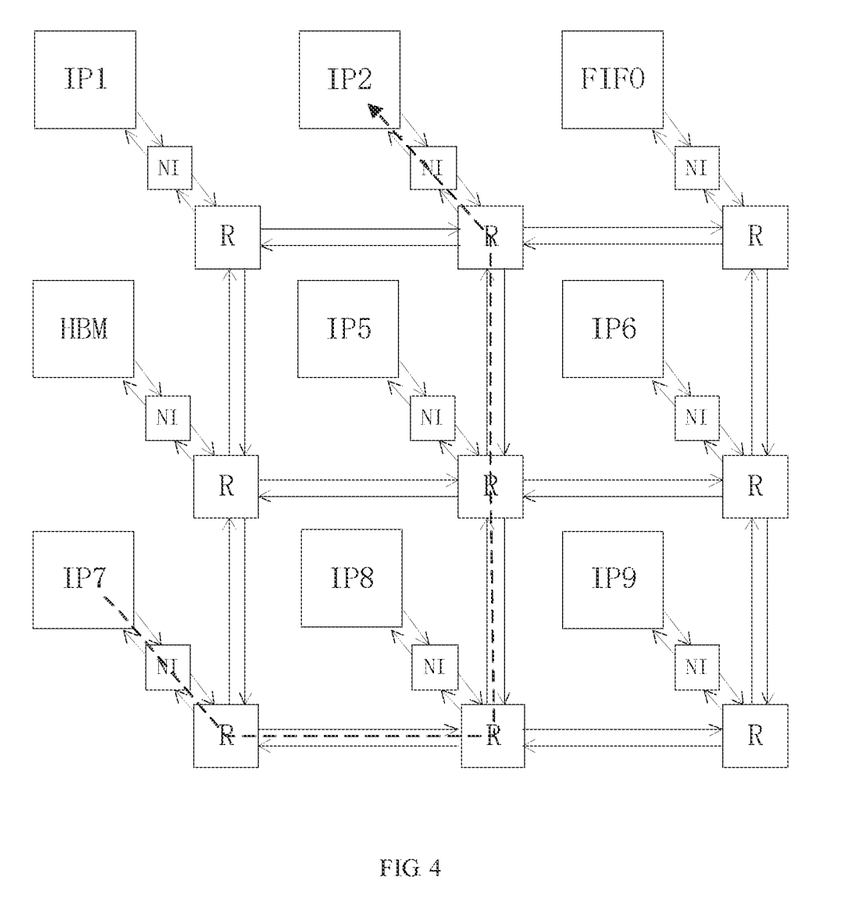
FIG. 4 is a schematic diagram of node connection of a silicon connection layer NOC network according to the present disclosure.

Various functional IP modules included in the silicon connection layer NOC network may have different functions. That is, the silicon connection layer NOC network includes at least two different functional IP modules, so as to implement different functions. As shown in FIG. 4, the functional IP modules included in the silicon connection layer NOC network include FIFO modules and are configured to implement a caching function. The functional IP modules included in the silicon connection layer NOC network further includes memory chips with integrated high-speed interfaces arranged in the silicon connection layer 5. The memory chip includes at least one of an HBM and a DDR5 and is configured to exchange data with each FPGA bare die at a high speed, which is conducive to improving the transmission bandwidth of the whole FPGA device.

According to various embodiments of the FPGA device of the present disclosure, when a predefined functional module with built-in hardcore IP nodes is integrated in an FPGA bare die, soft-core IP nodes are configured and formed by using logical resource modules in the FPGA bare die and are connected to the hardcore IP nodes to form an NOC network structure, so as to increase nodes and expand the transmission bandwidth of the predefined functional module. On the other hand, the soft-core IP nodes can be additionally connected to input and output signals in the predefined functional module and also can expand the transmission bandwidth of the predefined functional module. Further, the FPGA device further includes a silicon connection layer provided with a silicon connection layer NOC network, so that the nodes in the FPGA bare die can be connected to the silicon connection layer to constitute a larger NOC structure, further increasing the nodes and expanding the transmission bandwidth of the predefined functional module.

The above are only preferred implementations of the present disclosure, and the present disclosure is not limited to the above embodiments. It is to be understood that other improvements and changes directly derived or associated by those skilled in the art without departing from the spirit and conception of the present disclosure shall be deemed to be within the protection scope of the present disclosure.

What is claimed is:

1. An FPGA device for implementing expansion of a transmission bandwidth of a network-on-chip, wherein the FPGA device comprises an FPGA bare die, the FPGA bare die comprising a plurality of logical resource modules, the FPGA die further comprising a predefined functional module integrated inside, the predefined functional module comprising N built-in hardcore IP nodes, adjacent hardcore IP nodes being connected through routing channels, input and output signals of the predefined functional module being connected to the hardcore IP nodes; FPGA bare die further comprises M soft-core IP nodes configured and formed through the logical resource modules therein; the hardcore IP nodes and the softcore IP nodes in the FPGA bare die are connected through the routing channels to form an NOC network structure, the nodes comprising N hardcore nodes and M soft-core nodes, each of the nodes comprising a functional IP, a network interface and a router respectively, the functional IP being connected to the router through the network interface, the routers in every two adjacent nodes being connected through the routing channels; and the predefined functional module intercommunicates with external signals through the N built-in hardcore IP nodes and the M soft-core IP nodes formed by expansion.

2. The FPGA device according to claim 1, wherein a part of the input and output signals in the predefined functional module are connected to the built-in hardcore IP nodes, and the other part of said signals are connected to the M soft-core IP nodes configured and formed using the logical resource modules in the FPGA bare die.

3. The FPGA device according to claim 1, wherein input and output signals inside the FPGA bare die other than the input and output signals of the predefined functional module are connected to the M soft-core IP nodes to intercommunicate with an external structure outside the FPGA bare die.

4. The FPGA device according to claim 1, wherein each soft-core IP node is configured and formed by a single logical resource module in the FPGA bare die, or configured and formed jointly by the plurality of logical resource modules.

5. The FPGA device according to claim 1, wherein the logical resource modules in the FPGA bare die that are configured to configure and form soft-core IP nodes comprise at least one of a CLB, a BRAM and a DSP.

6. The FPGA device according to claim 1, wherein the predefined functional module integrated in the FPGA bare die is an AI module.

7. An FPGA device for implementing expansion of a transmission bandwidth of a network-on-chip, wherein the FPGA device comprises an FPGA bare die, the FPGA bare die comprising a plurality of logical resource modules, the FPGA die further comprising a predefined functional module integrated inside, the predefined functional module comprising N built-in hardcore IP nodes, adjacent hardcore IP nodes being connected through routing channels, input and output signals of the predefined functional module being connected to the hardcore IP nodes; FPGA bare die further comprises M soft-core IP nodes configured and formed through the logical resource modules therein; the hardcore IP nodes and the softcore IP nodes in the FPGA bare die are connected through the routing channels to form an NOC network structure, the nodes comprising N hardcore nodes and M soft-core nodes, each of the nodes comprising a functional IP, a network interface and a router respectively, the functional IP being connected to the router through the network interface, the routers in every two adjacent nodes being connected through the routing channels; and the predefined functional module intercommunicates with external signals through the N built-in hardcore IP nodes and the M soft-core IP nodes formed by expansion, wherein the FPGA device further comprises a substrate and a silicon connection layer laminated on the substrate, and the FPGA bare die is laminated on the silicon connection layer; a silicon connection layer NOC network is built within the silicon connection layer and comprises a plurality of silicon connection layer routing nodes connected through the routing channels, and each of the silicon connection layer routing nodes comprises a functional IP, a network interface and a router, the functional IP being connected to the router through the network interface;

wherein the FPGA bare die further comprises a silicon-stacked connection module and connection point leading-out terminals, the silicon-stacked connection module comprises a plurality of silicon-stacked connection points, the nodes in the FPGA bare die are connected to the corresponding silicon-stacked connection points, and the silicon-stacked connection points are connected to the corresponding connection point leading-out terminals through a top metal wire in a rewiring layer; and wherein the connection point leading-out terminals in the FPGA bare die that are connected to the nodes therein are connected to the routers in the silicon-stacked connection points through the routing channels, so that the nodes in the FPGA bare die are connected to the silicon connection layer routing nodes to form the NOC network structure, and the predefined functional module intercommunicates with the external signals through the N built-in hardcore IP nodes, the M soft-core IP nodes formed by expansion and the silicon connection layer routing nodes.

8. The FPGA device according to claim 7, wherein the silicon connection layer comprises a plurality of silicon connection layer routing nodes comprising different functional IPs.

9. The FPGA device according to claim 7, wherein the functional IPs in the silicon connection layer routing nodes are memory chips, and the memory chips comprise at least one of an HBM, a DDR4 and a DDR5.

10. The FPGA device according to claim 7, wherein the functional IPs in the silicon connection layer routing nodes are FIFO and configured to implement a caching function.

11. The FPGA device according to claim 7, wherein a part of the input and output signals in the predefined functional module are connected to the built-in hardcore IP nodes, and the other part of said signals are connected to the M soft-core IP nodes configured and formed using the logical resource modules in the FPGA bare die.

12. The FPGA device according to claim 7, wherein input and output signals inside the FPGA bare die other than the input and output signals of the predefined functional module are connected to the M soft-core IP nodes to intercommunicate with an external structure outside the FPGA bare die.

13. The FPGA device according to claim 7, wherein each soft-core IP node is configured and formed by a single logical resource module in the FPGA bare die, or configured and formed jointly by the plurality of logical resource modules.

14. The FPGA device according to claim 7, wherein the logical resource modules in the FPGA bare die that are configured to configure and form soft-core IP nodes comprise at least one of a CLB, a BRAM and a DSP.

15. The FPGA device according to claim 7, wherein the predefined functional module integrated in the FPGA bare die is an AI module.

16. The FPGA device according to claim 1, where the soft-core IP nodes are located outside the predefined functional module.

17. The FPGA device according to claim 7, where the soft-core IP nodes are located outside the predefined functional module.

* * * * *